(12) United States Patent
Koizumi et al.

(10) Patent No.: US 6,520,692 B2
(45) Date of Patent: Feb. 18, 2003

(54) EXPOSURE APPARATUS FOR PRINTING PLATES

(75) Inventors: Takashi Koizumi, Kanagawa (JP);
Yoshinori Kawamura, Kanagawa (JP);
Yoshihiro Koyanagi, Kanagawa (JP);
Kazuhisa Okamoto, Kanagawa (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/781,272

(22) Filed: Feb. 13, 2001

(65) Prior Publication Data

US 2001/0013928 A1 Aug. 16, 2001

(30) Foreign Application Priority Data

Feb. 14, 2000 (JP) ........................................ 2000-034943

(51) Int. Cl.⁷ ............................................. G03B 17/26
(52) U.S. Cl. .................... 396/518; 396/524; 242/348.4; 378/182; 378/188
(58) Field of Search ................................. 396/512, 517, 396/513, 519, 518, 524, 527; 206/455; 378/182, 186–188, 174

(56) References Cited

U.S. PATENT DOCUMENTS 4,493,545 A * 1/1985 Bauer et al. ................. 396/518
6,312,169 B1 * 11/2001 Keilegom et al. .......... 206/455

* cited by examiner

Primary Examiner—D. Rutledge
(74) Attorney, Agent, or Firm—Sughrue Mion, PLLC

(57) ABSTRACT

In an automatic exposure apparatus for printing plates, a photopolymer plate is taken out of an accommodating cassette in which stacked photopolymer plates are accommodated, and an image is recorded onto the photopolymer plate. A shutter which opens and closes an opening of the accommodating cassette is configured as a thin plate, and thus, the accommodating cassette is thin and light.

29 Claims, 10 Drawing Sheets

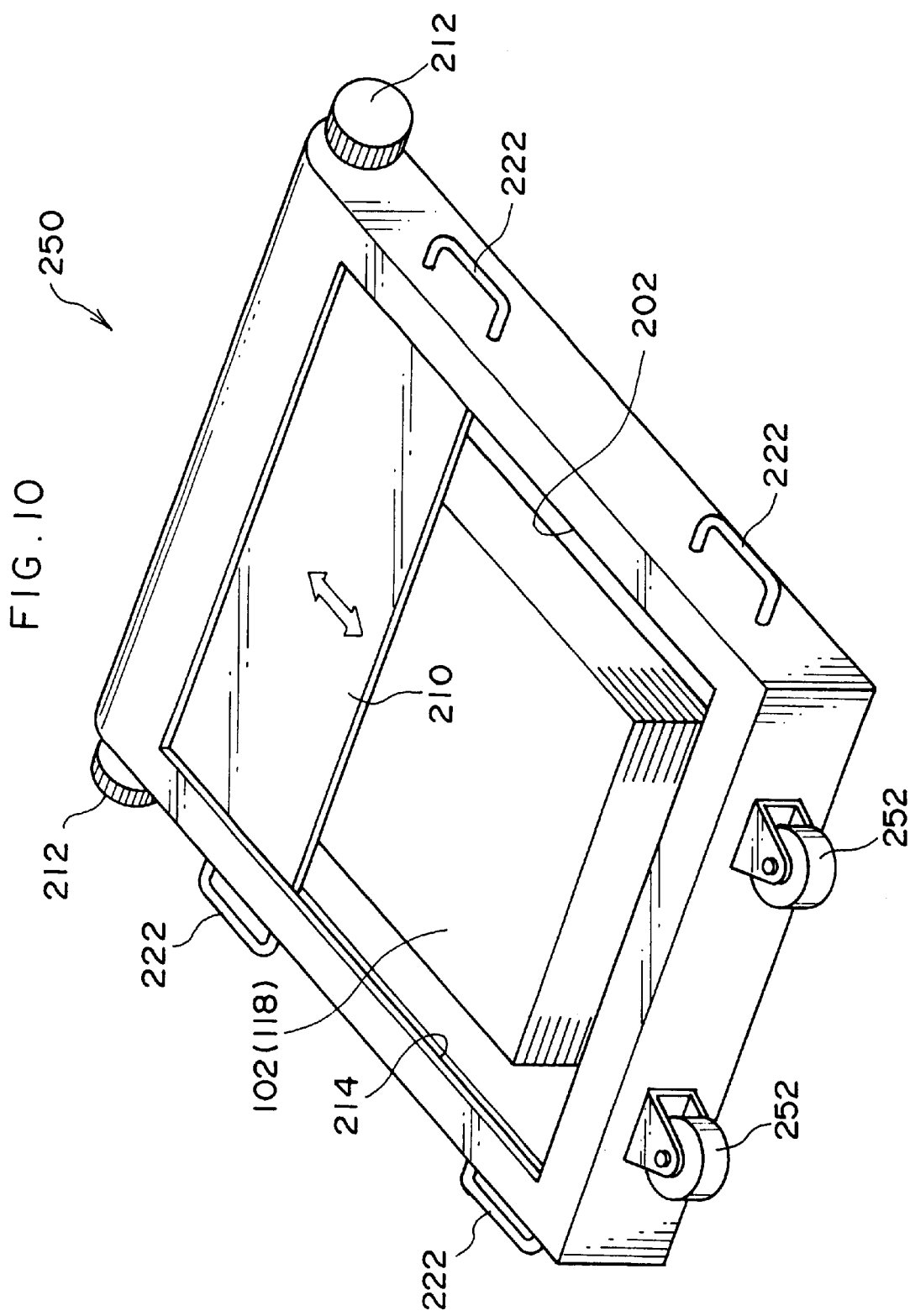

EXPOSURE APPARATUS FOR PRINTING PLATES

BACKGROUND OF THE INVENTION

1. Field of the Invention

The present invention relates to an exposure apparatus for printing plates, which takes a printing plate out of an accommodating cassette which accommodates printing plates and records an image onto the printing plate.

2. Description of the Related Art

In a conventional exposure apparatus for printing plates, for example, an accommodating cassette is loaded. In the accommodating cassette, a plurality of printing plates (e.g., photopolymer plates), in which photosensitive layers (e.g., photopolymer layers) are provided on supports, are accommodated in a stacked state. The accommodating cassette is provided with an opening which opposes an exposure surface (a surface at a photosensitive layer side) of the printing plate. The opening is provided with an open-close shutter. Accordingly, the open-close shutter is slid in an opening direction in a darkroom, and the printing plates are accommodated in the accommodating cassette in the state in which the opening is opened. After that, the open-close shutter is slid in a closing direction, and, for example, the accommodating cassette is loaded into the apparatus in the state in which the opening is closed. As a result, the printing plates are prevented from being unnecessarily exposed to light and thus image quality is not adversely affected.

In these types of exposure apparatus for printing plates, the open-close shutter is slid in the opening direction inside the apparatus, and the printing plate is taken out of the accommodating cassette in the state in which the opening is opened, and then, an image is recorded onto an exposure surface of the printing plate.

However, in these exposure apparatus for printing plates, the open-close shutter needs to be curved when the open-close shutter is slid in the opening direction, and thus, the open-close shutter has a structure in which a plurality of wide-short plates are tiltably connected to each other (shutter known as a bellows type). As the open-close shutter having such a structure is thick, the accommodating cassette is also thick. Therefore, the accommodating cassette was very heavy. Accordingly, the accommodating cassette was not easy to lift, and thus, there was a problem that operation of conveying the accommodating cassette is difficult (conveying the accommodating cassettes required a lot of strength).

Further, in these exposure apparatus for printing plates, a bracket is provided at a leading end of the open-close shutter in the closing direction, and actuator sensors are provided inside the accommodating cassette so as to correspond with the bracket. When the bracket contacts the actuator sensors, the states in which the open-close shutter is opened and closed are detected. As the bracket protruded outside the opening of the accommodating cassette, there was a possibility that safety was compromised, and further there was a problem of inferior design as well.

SUMMARY OF THE INVENTION

In consideration of the above facts, it is an object of the present invention to obtain an exposure apparatus for printing plates, which can facilitate the operation of conveying the accommodating cassette.

A first aspect of the present invention is an exposure apparatus for printing plates, into which is loaded a cassette, having therein a predetermined number of printing plates accommodated in a stacked state and which takes the printing plates out of the cassette, and records an image onto an exposure surface of each of the printing plates; wherein the apparatus comprises: an opening for accommodating the printing plates into the cassette and for taking the printing plates out of the cassette, which opening is provided at a portion of the cassette which portion opposes the exposure surface of the printing plate; and a shutter provided at the opening, the shutter comprising a flexible structure slidable to a closed position closing the opening to the cassette, and to an open position, in which the opening to the cassette is open.

In the exposure apparatus for printing plates according to the first aspect of the present invention, the flexible shutter is slid in the opening direction so as to open the opening of the accommodating cassette in a darkroom, and in this opened state, a predetermined number of printing plates which are stacked are accommodated into the accommodating cassette through the opening.

After that, the shutter is slid in the closing direction so as to close the opening, and in this closed state, the accommodating cassette is loaded into the apparatus. As a result, even if light is emitted from the outside of the accommodating cassette, the printing plates can be prevented from being unnecessarily exposed to light and thus their quality is not adversely affected.

After the accommodating cassette has been loaded into the apparatus, the shutter is slid in the opening direction so as to open the opening. In this opened state, the printing plate is taken out of the accommodating cassette through the opening, and an image is recorded onto an exposure surface of the printing plate.

The shutter is configured as a thin plate, and thus, the accommodating cassette can be accordingly thin. As a result, the accommodating cassette is lightened such that the operation of conveying the accommodating cassette can be facilitated (conveying the accommodating cassette does not require much strength).

A second aspect of the present invention is an exposure apparatus for printing plates, wherein the opening includes a periphery having opposite sides, with a groove defined in each side, and the shutter includes opposite peripheral edges which are each received in a groove and slide therealong as the shutter is moved to the closed and open positions.

According to the exposure apparatus for printing plates, in the state in which the opening of the accommodating cassette is closed by the shutter, the peripheral edge of the shutter is inserted into the light-shielding groove formed at the periphery of the opening. Accordingly, even if a special light-shielding member is not used, the printing plates can be completely prevented from being unnecessarily exposed to light and thus their quality is not adversely affected.

Further, as described above, a special light-shielding member does not need to be used, and thus, the accommodating cassette can be thinner. As a result, the accommodating cassette is made even lighter such that the operation of conveying the accommodating cassette is further facilitated.

A third aspect of the present invention is an exposure apparatus for printing plates, further comprising sprockets rotatably mounted in the cassette, the sprockets including engagement pins and the shutter including engagement holes corresponding to the engagement pins, with the shutter entrained around the sprockets and moving to closed and open positions when the sprockets rotate.

In the exposure apparatus for printing plates, when the sprockets provided in the accommodating cassette are rotated, the engagement pins of the sprocket sequentially engage with the engagement holes of the shutter, and the shutter is slid. As a result, an operation of sliding the shutter becomes smooth, and the operation of opening and closing of the shutter can be carried out satisfactorily.

A fourth aspect of the present invention is an exposure apparatus for printing plates, wherein the engagement holes are circular and the engagement pins have a circular cross-section.

In the exposure apparatus for printing plates, since the engagement hole of the shutter is circular, and a cross-section of the engagement pin of the sprocket is circular, load applied when the engagement pin engages with the engagement hole is dispersed. Accordingly, the shutter and the sprockets can be prevented from being broken or deformed.

A fifth aspect of the present invention is an exposure apparatus for printing plates, further comprising: a detection member provided on the shutter and movable with the shutter when the shutter moves to open and closed positions; and sensors provided in accordance with locations of the detection member when the shutter is in the open and closed positions, the sensors detecting proximity of the detection member and producing an electronic output indicating when the shutter is in the open and closed positions.

In the exposure apparatus for printing plates, when the sensors, which are provided so as to correspond with positions of the member for detection in the states in which the shutter is opened and closed, detect that the member for detection is in proximity thereto, the state in which the shutter is opened or closed is detected.

Since the member for detection is provided at the rear end of the shutter in the closing direction, the member for detection is always positioned inside the accommodating cassette so as not to be exposed at (protrude from) the opening. Accordingly, safety and design is satisfactory.

Furthermore, as described above, the member for detection does not protrude from the opening of the accommodating cassette, and thus, the accommodating cassette can be even thinner. As a result, the accommodating cassette is made even lighter such that the operation of conveying the accommodating cassette can be facilitated even more.

A sixth aspect of the present invention is an exposure apparatus for printing plates, further comprising casters mounted to the cassette, which support the cassette and provide for rolling the cassette along a surface.

In the exposure apparatus for printing plates, casters are provided at the bottom portion of the accommodating cassette, and thus, the accommodating cassette can be conveyed in the state in which the accommodating cassette is supported by the casters. As a result, regardless of weight of the accommodating cassette, the operation of conveying the accommodating cassette can be reliably facilitated.

BRIEF DESCRIPTION OF THE DRAWINGS

FIG. 4C is a side view of an essential portion of an interleaf sheet conveying port on.

FIG. 10 is a perspective view of an accommodating cassette relating to a modified example.

DESCRIPTION OF THE PREFERRED EMBODIMENTS (Overall Structure)

Figure 1:
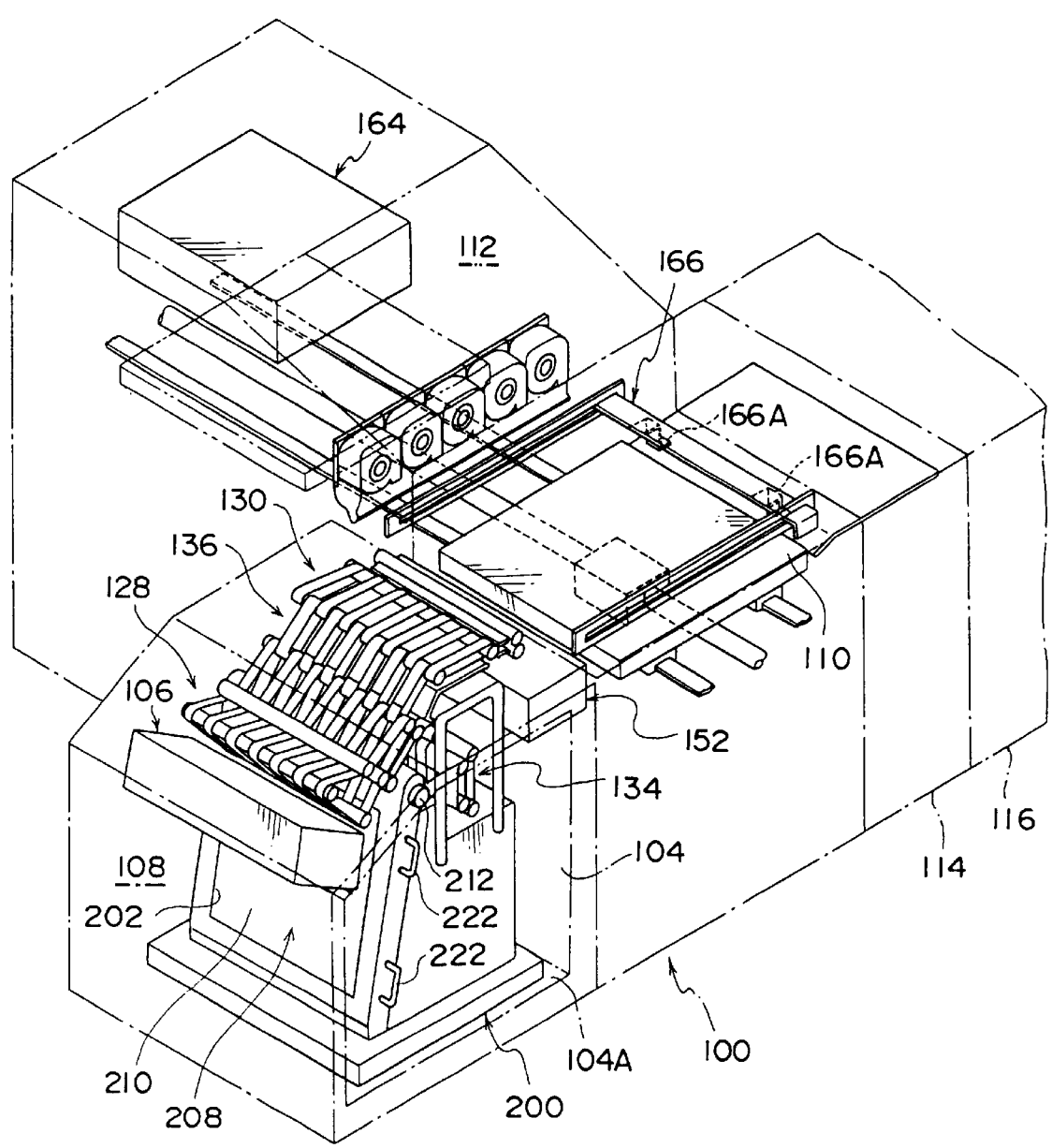
FIG. 1 is a perspective view showing an overall structure of an automatic exposure apparatus for printing plates, relating to the present embodiment.

An automatic exposure apparatus 100 for printing plates, relating to the present embodiment, which apparatus is used for photopolymer plates (i.e., printing plates in which photosensitive layers (e.g., photopolymer layers) are provided on aluminum supports), is shown in FIG. 1.

Figure 2:
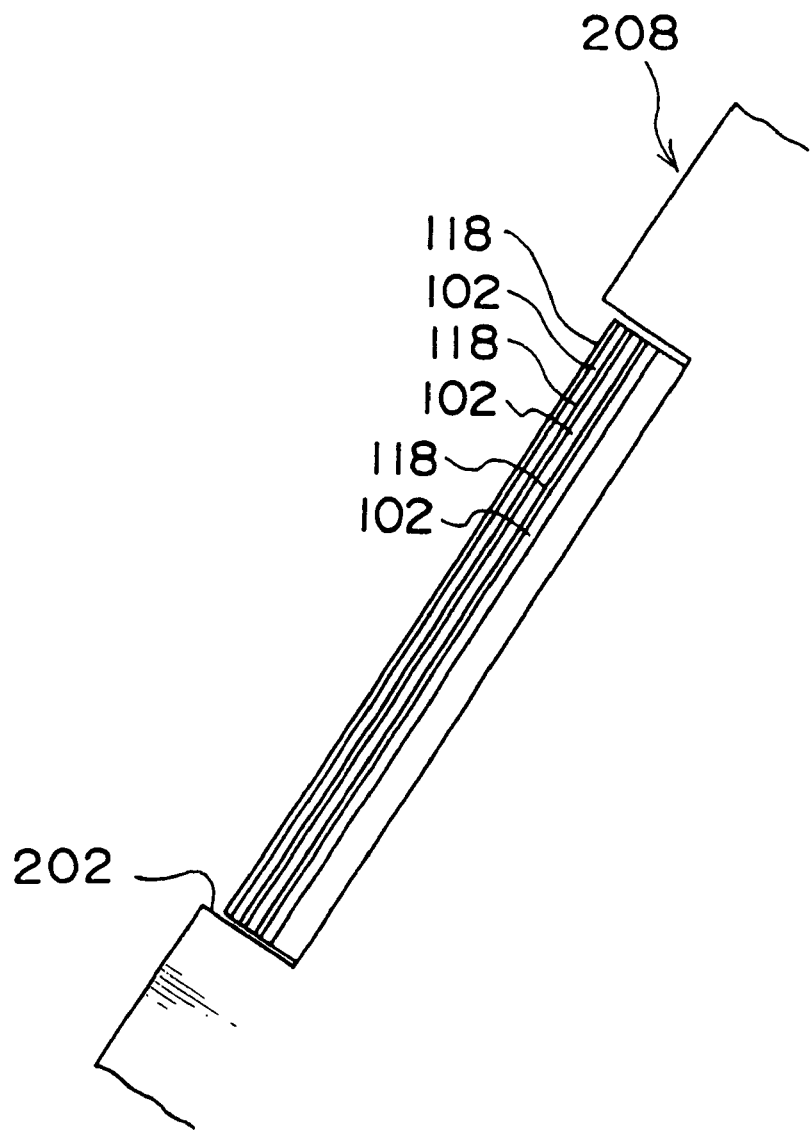
FIG. 2 is a side view showing a state in which photopolymer plates and interleaf sheets are loaded in a magazine.

The automatic exposure apparatus 100 for printing plates, consists of a plate supplying section 108, which includes a plate accommodating portion 104 that accommodates photopolymer plates 102 (see FIG. 2) loaded on a trolley 200, and includes a sheet feeding portion 106 that carries out the photopolymer plate 102 accommodated in the plate accommodating portion 104; a surface plate 110 on which the photopolymer plate 102 is positioned and held; and an exposure section 112 which records an image on the photopolymer plate 102 positioned on the surface plate 110.

An automatic developing apparatus 116 for printing plates, can be provided at a downstream side of the automatic exposure apparatus 100 for printing plates, via a buffer portion 114. Thus, all of the plate-supplying, exposing and developing processes can be automatically carried out.

Figure 3:
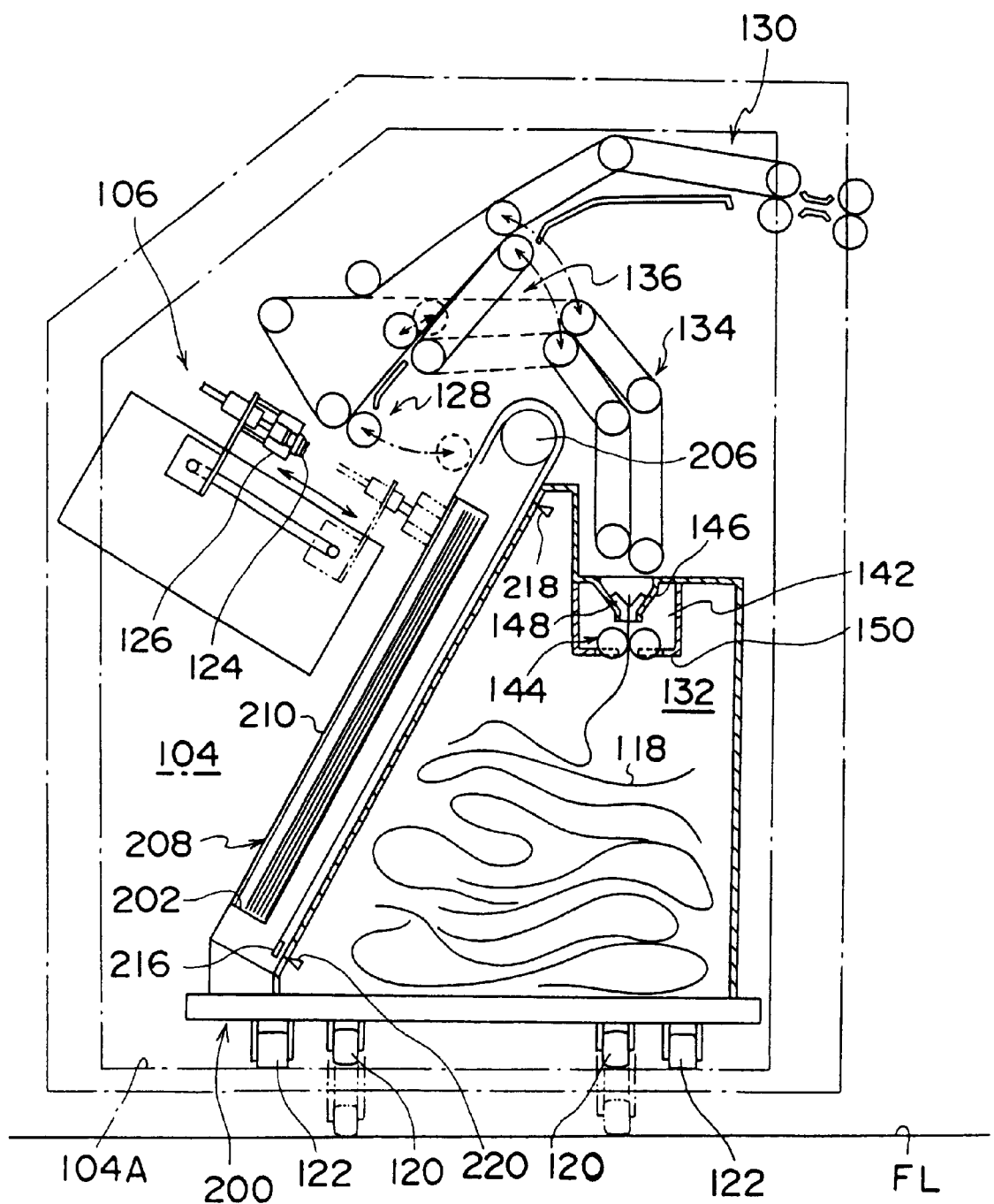
FIG. 3 is a side view of a plate supplying section.

The plate accommodating portion 104 can accommodate the trolley 200, on which an accommodating cassette 208 accommodating a plurality of photopolymer plates 102 is loaded (FIG. 3). A protective interleaf sheet 118 is provided on a surface of each photopolymer plate 102 (FIG. 2), and as a result, the photopolymer plates 102 and the interleaf sheets 118 are alternately superimposed.

The plate accommodating portion 104 forms a floor portion 104A at a higher position than a ground surface, and the trolley 200 is structured so that it can be mounted onto the floor portion 104A from the ground surface. Specifically, the trolley 200 is supported to the ground surface via casters 120, and each of the casters 120 can move to protruding positions (i.e., the positions shown with notched lines in FIG. 3) or to storing positions (i.e., the positions shown with solid lines in FIG. 3) with respect to the trolley 200.

At the same time when the casters 120 move to the stored positions so as to be upwardly collapsed toward the plate accommodating portion 104 due to a storing operation, auxiliary rollers 122 correspond to the floor portion 104A. Thereafter, the trolley 200 is supported to the floor portion 104A via the auxiliary rollers 122.

The sheet feeding portion 106 is provided above the plate accommodating portion 104. The sheet feeding portion 106 is structured so as to alternately take up the photopolymer plate 102 and the interleaf sheet 118 from a state in which they are stacked, and send them to a common conveying portion 128. The sheet feeding portion 106 includes a sucker 124, which sucks the photopolymer plate 102 and the interleaf sheet 118. Further, a suction fan 126 is separately provided near the sucker 124, as an auxiliary means for sucking the interleaf sheet 118. The sucker 124 and the suction fan 126 can move integrally toward and away from a surface of an interleaf sheet 118 or of a photopolymer plate 102, which are stacked together.

When the photopolymer plate 102 is sucked and held, the sucker 124 is disposed so as to be in contact with the photopolymer plate 102. On the other hand, when the interleaf sheet 118 is sucked and held, the suction fan 126 is disposed such that the interleaf sheet 118 is slightly away from (or may be disposed so as to be in contact with) it, and only the suction fan 126 is operated. The suction fan 126 sucks up only the interleaf sheet 118 which is lighter and thinner than the photopolymer plate 102, and thereafter, the sucker 124 sucks the interleaf sheet 118. As a result, when the interleaf sheet 118 is sucked, double suction (i.e., suction of the interleaf sheet 118 together with the underlying photopolymer plate 102) is prevented.

The plate supplying section 108 largely consists of the common conveying portion 128, a photopolymer plate conveying portion 130, an interleaf sheet conveying portion 134, and a conveyance switch portion 136. The common conveying portion 128 receives the photopolymer plate 102 or the interleaf sheet 118 from the sheet feeding portion 106 and conveys it. The photopolymer plate conveying portion 130 receives the photopolymer plate 102 and sends it to the surface plate 110. The interleaf sheet conveying portion 134 receives the interleaf sheet 118 and sends it to an interleaf sheet accommodating box 132 (loaded on the trolley 200). The conveyance switch portion 136 guides the photopolymer plate 102 or the interleaf sheet 118 from the common conveying portion 128 to either the photopolymer plate conveying portion 130 or the interleaf sheet conveying portion 134 by a switching operation.

Specifically, as the photopolymer plates 102 and the interleaf sheets 118 are alternately stacked, each time the photopolymer plate 102 or the interleaf sheet 118 is sucked at the sheet feeding portion 106, the conveyance switch portion 136 switches and conveys the photopolymer plate 102 or the interleaf sheet 118 to the respective predetermined direction.

Figure 4A:
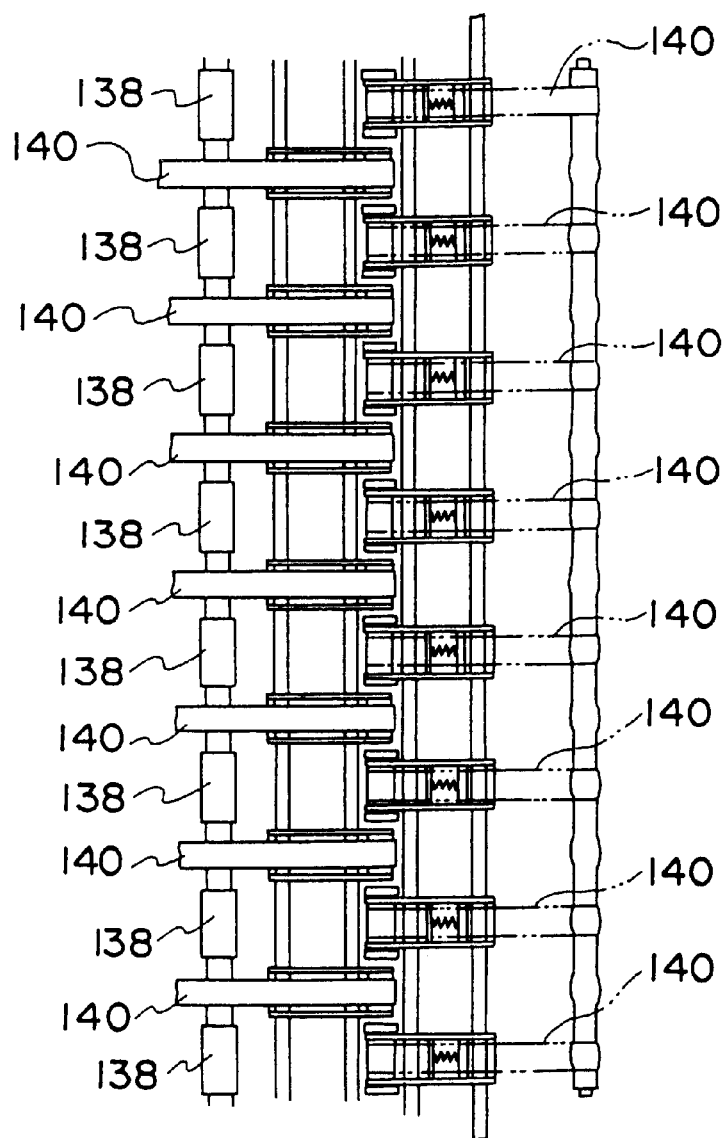
FIG. 4A is a plan view showing a portion of a conveying system of the plate supplying section.
Figure 4B:
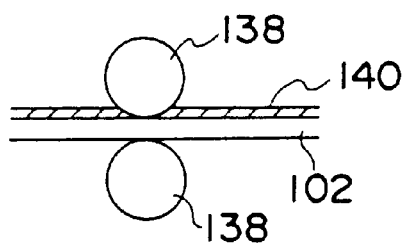
FIG. 4B is a side view showing a portion of the conveying system of the plate supplying section.

The common conveying portion 128, the photopolymer plate conveying portion 130 and the conveyance switch portion 136 are a conveying system in which skewered rollers 138 and narrow belts 140 are combined (FIG. 4A). This conveying system mainly conveys the photopolymer plate 102 (FIG. 4B). Specifically, the photopolymer plate 102 is conveyed with a strong nipping force of the skewered rollers 138, and the narrow belts 140 serve as guide panels which move synchronously with the conveyance.

Figure 4C:
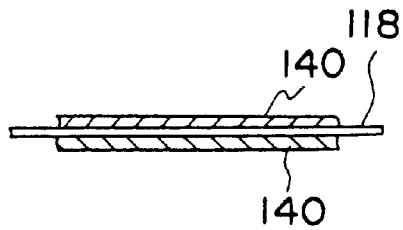

On the other hand, the interleaf sheet conveying portion 134 is a conveying system including only the narrow belts 140 (FIG. 4C). This conveying system is structured so as to convey the interleaf sheet 118 with a weak nipping force of the narrow belts 140.

Figure 5:
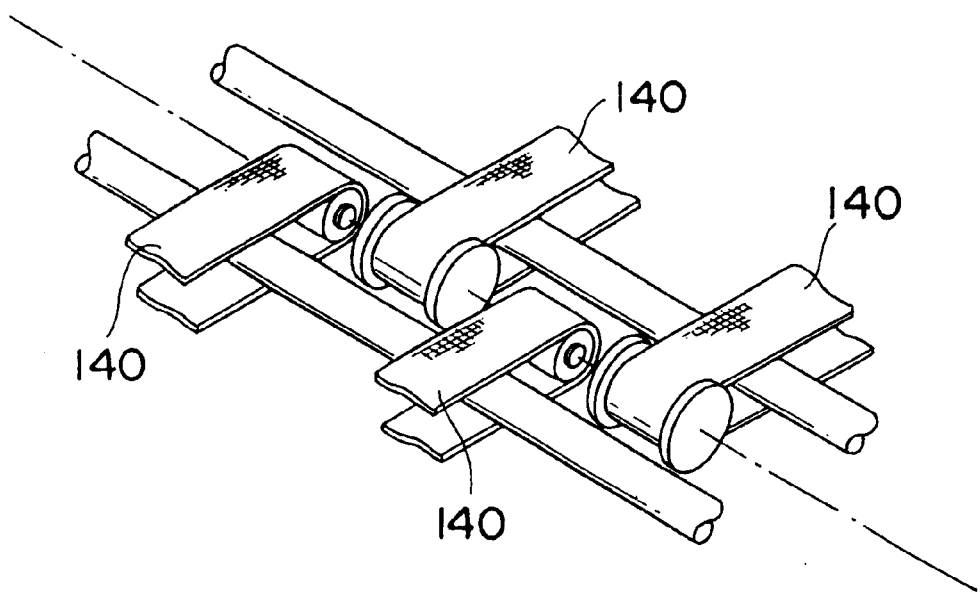
FIG. 5 is a perspective view showing a delivery portion for passing the printing plates between different conveying systems of the plate supplying section.

At a portion for delivery from one conveying portion to another, end portions thereof alternately protrude in a skewered configuration, such that a recessed end portion of one corresponds to a protruded end portion of the other (i.e., both end portions have a coaxial common conveying path) (FIG. 5). As a result, when the photopolymer plate 102 and the interleaf sheet 118 are delivered, they are prevented from being caught in the skewered rollers 138 and the narrow belts 140.

The interleaf sheet 118 conveyed by the interleaf sheet conveying portion 134 is guided to the interleaf sheet accommodating box 132 provided on the trolley 200 (FIG. 3). An insertion opening 142 for the interleaf sheets 118, which is provided at an upper portion of the interleaf sheet accommodating box 132, is provided with a pair of rollers 144. The rollers 144 drive rotatively at a linear velocity, which is slightly higher (about 1.1 times) than the conveyance velocity of the interleaf sheet conveying portion 134. Accordingly, when the interleaf sheet 118 is between the interleaf sheet conveying portion 134 and the rollers 144, the interleaf sheet 118 is conveyed while maintaining a predetermined tense state. As a result, jamming resulting from slackness and the like is prevented.

Tapered guide panels 146, by which the width (in the thickness direction of the interleaf sheet 118) is gradually narrowed, are provided at an upstream side of the insertion opening 142. A charge removing brush 148 is attached to each of the tapered guide panels 146 which oppose each other, and the charge removing brushes 148 remove charge from the interleaf sheet 118 inserted into the insertion opening 142.

The pair of rollers 144 are arranged in a skewered configuration, and partition panels 150 are provided along the protruding portions which result from the skewered configuration. As a result, even if a part of the interleaf sheet 118, which has been inserted into the insertion opening 142, touches the rollers 144, the partition panels 150 prevent the interleaf sheet 118 from being caught in the rollers 144.

The photopolymer plate 102 conveyed by the photopolymer plate conveying portion 130 leaves the photopolymer plate conveying portion 130 in a horizontal conveyance state, and is delivered to the surface plate 110 (FIG. 1).

Figure 6A:
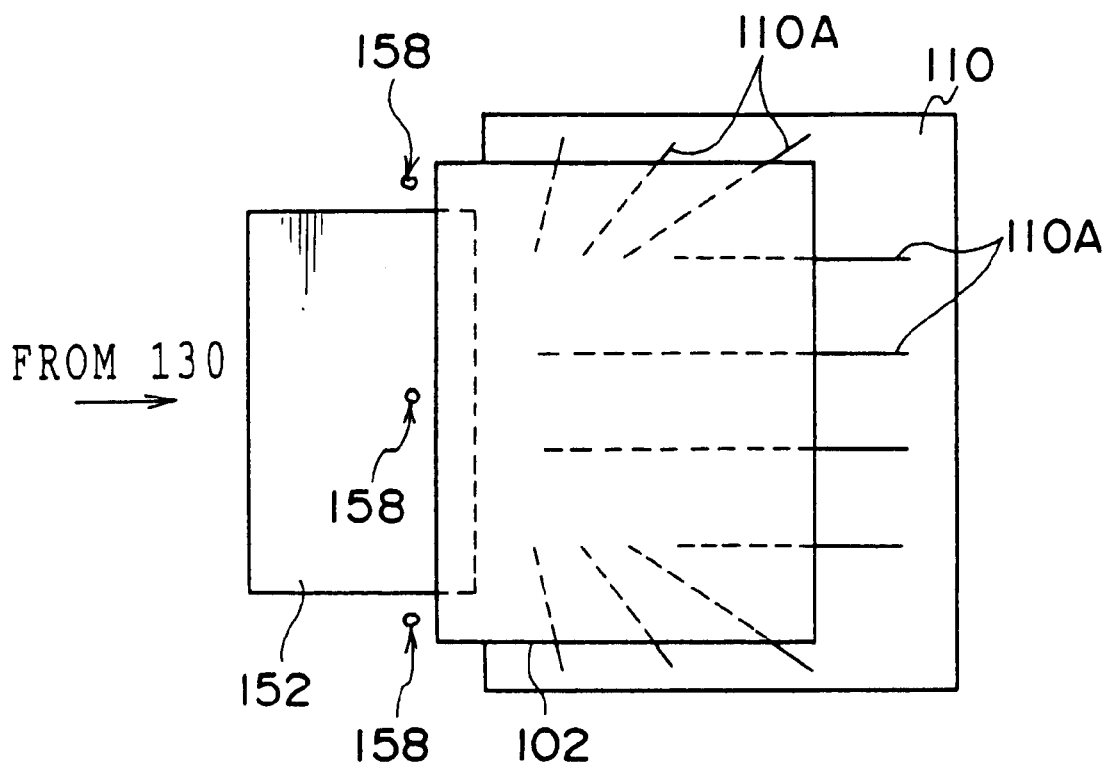
FIG. 6A is a plan view of a surface plate.

A height of a top surface of the surface plate 110 is lower than a horizontal conveyance height of the photopolymer plate conveying portion 130, and there is a slight gap therebetween in the conveying direction. Accordingly, when the photopolymer plate 102 is discharged from the photopolymer plate conveying portion 130, the photopolymer plate 102 lands on the surface plate 110 in a state in which it hangs slightly, and a rear end portion of the photopolymer plate 102 in the conveying direction is positioned at a more upstream position than the surface plate 110. A temporary support plate 154, which is provided on a moving body 152 that can move toward and away from the surface plate 110, is disposed at this upstream position, and the temporary support plate 154 prevents the photopolymer plate 102 from hanging (FIGS. 6A and 6B).

Figure 6B:
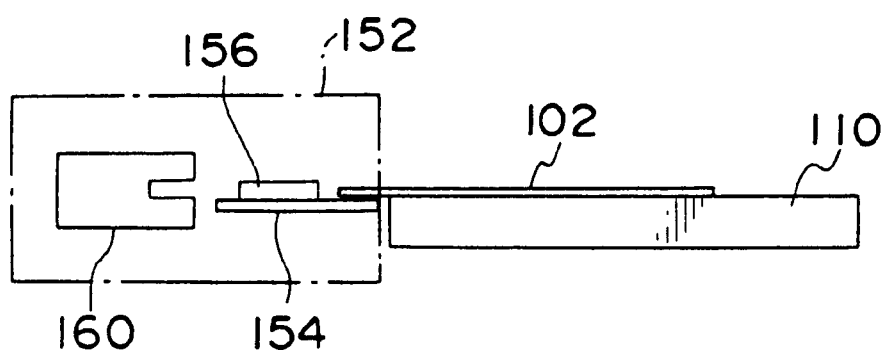
FIG. 6B is a side view of the surface plate.

A pressing plate 156 for pressing the rear end portion of the photopolymer plate 102 in the conveying direction is provided at a part of the temporary support plate 154 (FIG. 6B). When the rear end portion of the photopolymer plate 102 is pressed by the pressing plate 156, the curl of the photopolymer plate 102 is eliminated, and the photopolymer plate 102 can be sent to a predetermined standard position in the conveying direction. When the photopolymer plate 102 is at the standard position, the rear end portion thereof in the conveying direction slightly juts out from the surface plate 110.

In the standard position, sensors 158 are provided at a plurality of positions including both corners of the rear end portion of the photopolymer plate 102 in the conveying direction. When the rear end portion of the photopolymer plate 102 in the conveying direction is detected by the sensors 158, the pressing of the pressing plate 156 is discontinued. Further, the sensors 158 are also applied for detecting the position of the photopolymer plate 102 in the transverse direction of conveyance. Specifically, the corners of the photopolymer plate 102 are adjusted so as to be in line with the sensors 158 by moving the surface plate 110 in the transverse direction of conveyance, and the detected position is registered as a start position of the photopolymer plate 102.

The position of the photopolymer plate 102 moved to the start position is determined relative to a starting position of scanning exposure at the exposure section 112. The photopolymer plate 102 is sucked and held by suction grooves 110A provided at the surface plate 110.

A punch-hole is formed in the photopolymer plate 102 which is sucked and held, by a puncher 160 provided on the moving body 152.

The surface plate 110 can move back and forth at an uniform velocity between a first position (see the position shown with solid lines in FIG. 1), at which the photopolymer plate 102 is received from the photopolymer plate conveying portion 130, and a second position (see the position shown with notched lines in FIG. 1), at which the photopolymer plate 102 is accommodated in the exposure section 112. (Movement in the transverse direction of the conveyance for positioning also takes place in this back and forth manner.)

At the exposure section 112, a scanning unit 164 is provided above the conveying path of the surface plate 110. In the scanning unit 164, laser beams which are light-controlled in accordance with image signals are primarily scanned (in the direction orthogonal to the conveying direction of the surface plate 110). On the other hand, forward conveyance of the surface plate 110 is a movement for secondary scanning. As a result, an image is recorded onto the photopolymer plate 102 on the surface plate 110 during the forward conveyance to the exposure section 112, and then, the photopolymer plate 102 is returned to the original position by return conveyance. After being returned to the original position, the photopolymer plate 102 on the surface plate 110 is released from the state of being sucked and held.

Figure 7A:
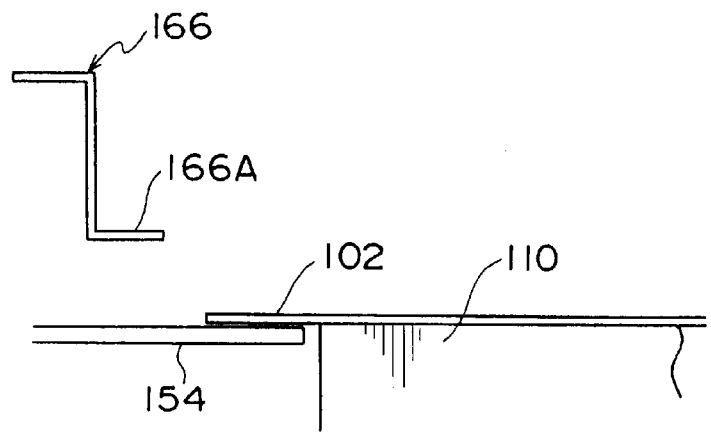
FIG. 7A is a side view showing an operation of a discharging mechanism portion at the beginning thereof.

A discharging mechanism portion 166 is on standby at the rear end portion side of the photopolymer plate 102 in the direction that the plate is conveyed by the photopolymer plate conveying portion 130. When the image has been recorded on the photopolymer plate 102 and the surface plate 110 has been returned to the original position, the discharging mechanism portion 166 which has been on standby passes over the surface plate 110 so as to move to a front end portion side of the photopolymer plate 102 in the conveying direction (FIG. 7A).

Figure 7B:
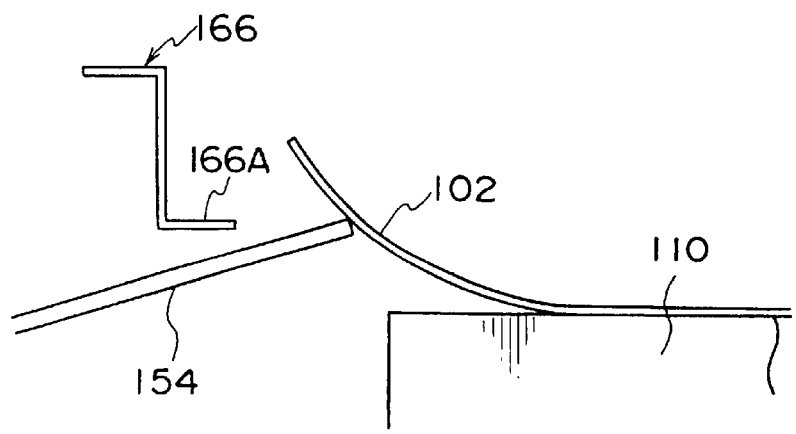
FIG. 7B is a side view showing an operation of the discharging mechanism portion in a state in which the photopolymer plate is lifted up.
Figure 7C:
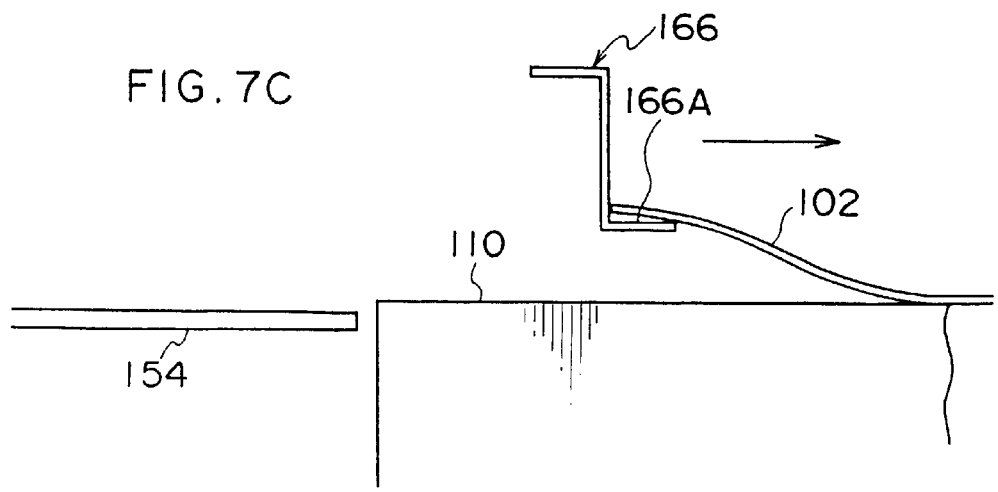
FIG. 7C is a side view showing an operation of the discharging mechanism portion at the time of discharging the photopolymer plate.

Hook portions 166A for loading the rear end portion of the photopolymer plate 102 in the conveying direction are formed at the discharging mechanism portion 166. The rear end portion of the photopolymer plate 102 which juts out from the surface plate 110 is lifted up by the temporary support plate 154 provided on the moving body 152 (FIG. 7B), and the discharging mechanism portion 166 is moved in the direction that the photopolymer plate 102 is conveyed. As a result, while the discharging mechanism portion 166 is moved, the photopolymer plate 102 is engaged with the hook portions 166A, and the photopolymer plate 102 is conveyed to a downstream side of the surface plate 110 (FIG. 7C). The buffer portion 114 and the automatic developing apparatus 116 for printing plates, are provided at this downstream side. While the difference between a discharging speed at the discharging mechanism portion 166 and a conveying speed at the automatic developing apparatus 116 for printing plates is absorbed by the buffer portion 114, the photopolymer plate 102 is smoothly sent out.

(Detailed Structure of Accommodating Cassette 208)

Figure 8:
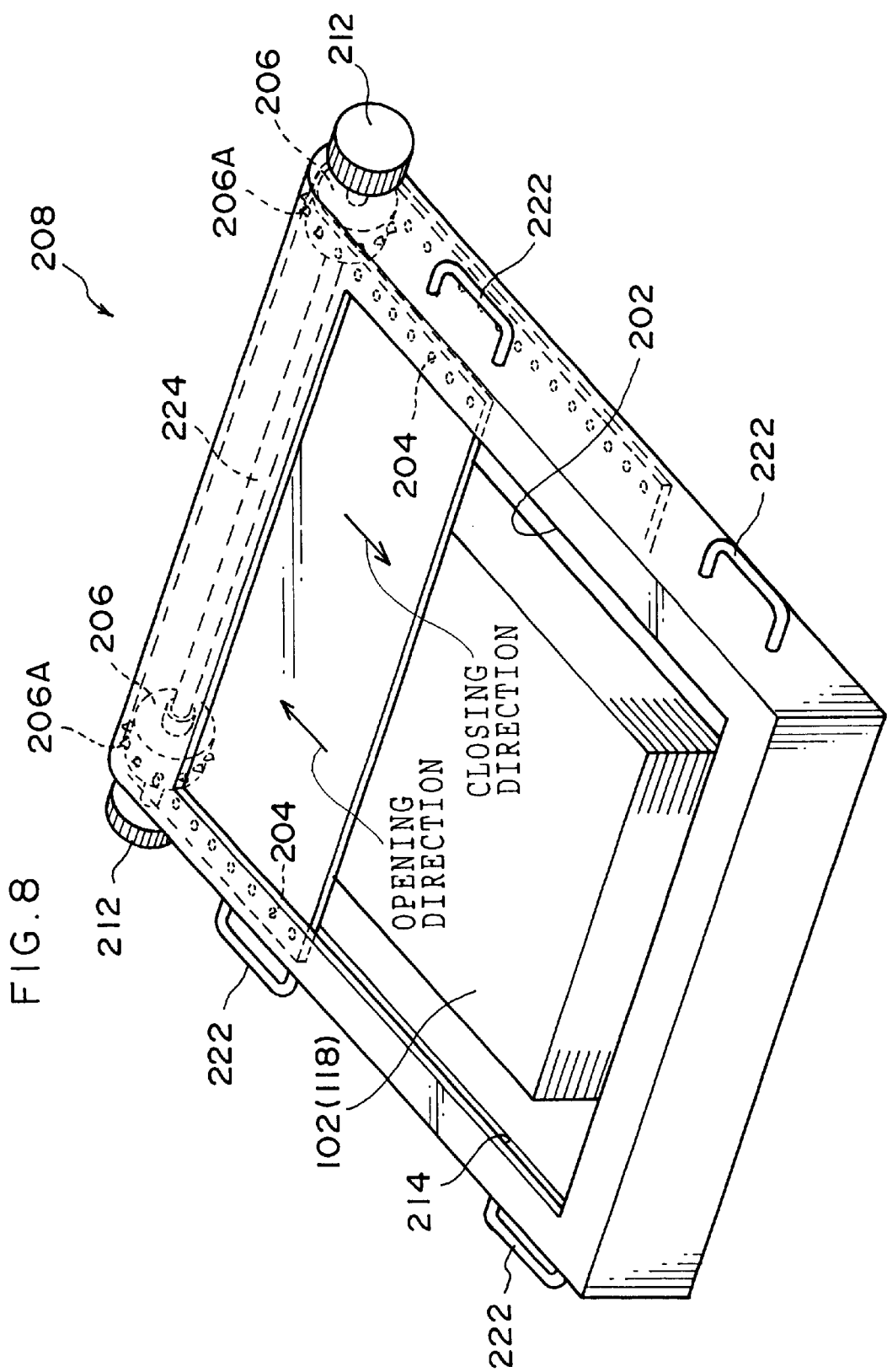
FIG. 8 is a perspective view of an accommodating cassette.

FIG. 8 is a perspective view of the accommodating cassette 208.

The accommodating cassette 208 is loaded on the trolley 200. The trolley 200 is accommodated in the plate accommodating portion 104, and the accommodating cassette 208 is thereby loaded into the automatic exposure apparatus 100 for printing plates.

Several tens of photopolymer plates 102 (generally, 60 photopolymer plates having an overall thickness of about 50 mm) are stacked in advance and accommodated in the accommodating cassette 208. The accommodating cassette 208 is provided with an opening 202 which opposes an exposure surface (a surface at a photosensitive layer side) of the photopolymer plate 102. The photopolymer plates 102 can be accommodated into and taken out of the accommodating cassette 208 through the opening 202.

The opening 202 is provided with a shutter 210. The shutter 210 is configured as a thin plate and is flexible (e.g., SUS304CSP (SUS spring steel); this type of shutter has a severity of quench of ½ H, a thickness of 0.15 mm, a length of 900 mm and a width of 900 mm; this thickness is one tenth to one twentieth of that of a conventional shutter known as a bellows type).

At both end portions of the shutter 210 in the transverse direction, a plurality of engagement holes 204 are formed at regular intervals along the end portions of the shutter 210 in the transverse direction (along the direction in which the shutter 210 is slid). Inside the accommodating cassette 208, a pair of sprockets 206 are rotatably provided in accordance with the engagement holes 204. The pair of sprockets 206 are fixed to a rotation axis 224, and turntables 212 disposed outside the accommodating cassette 208 are connected to both ends of the rotation axis 224. When the turntables 212 are rotated, the sprockets 206 can be integrally rotated via the rotation axis 224. A plurality of engagement pins 206A are provided on a peripheral wall of the sprocket 206 in accordance with the engagement holes 204. When the sprocket 206 is rotated, the engagement pins 206A sequentially engage with the engagement holes 204, and the shutter 210 is slid in an opening or closing direction. Accordingly, the opening 202 can be opened or closed by the shutter 210. If the shutter 210 is closed in a location other than a darkroom, the photopolymer plates 102 are prevented from being unnecessarily exposed to light. In other words, the accommodating cassette 208 (trolley 200) is transported between the darkroom in which the photopolymer plates 102 are stored and the plate accommodating portion 104, and the photopolymer plates 102 can be protected by the shutter 210 during the transportation. Further, in a state in which the accommodating cassette 208 is loaded on the trolley 200, the sprockets 206 can be rotated by driving force from the trolley 200. The shutter 210 is curved at the peripheral wall portions of the sprockets 206. Accordingly, when the shutter 210 is slid in the opening direction, a leading end side of the shutter 210 in the opening direction is accommodated inside an inner wall of the accommodating cassette 208, which inner wall opposes the opening 202.

The engagement hole 204 of the shutter 210 is circular, and a cross-section of the engagement pin 206A of the sprocket 206 is circular. Therefore, load applied when the engagement pin 206A engages with the engagement hole 204 can be dispersed.

Figure 9:
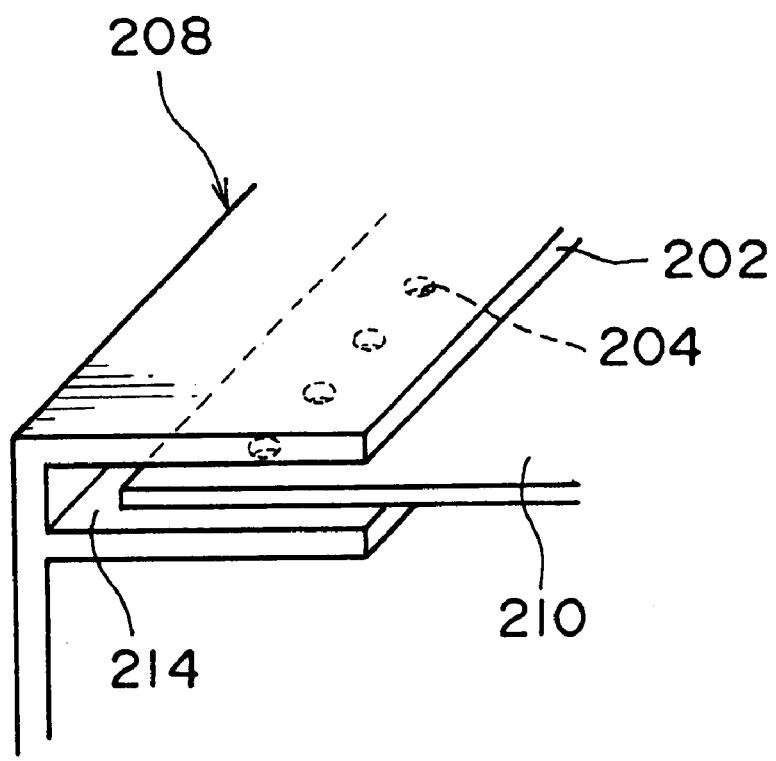
FIG. 9 is a perspective view of a light-shielding groove.

A light-shielding groove 214 is formed at a periphery on both sides in the transverse direction and a lower side of the opening 202 (FIG. 9). The light-shielding groove 214 has, for example, a width of 3 mm and a depth of 16 mm. A peripheral edge of the shutter 210 is inserted into the light-shielding groove 214 in a state in which the opening 202 is closed by the shutter 210. As a result, the photopolymer plates 102 are prevented even further, from being unnecessarily exposed to light. Further, in the state in which the opening 202 is closed by the shutter 210, all the engagement holes 204 of the shutter 210 are accommodated in the light-shielding groove 214 or in the accommodating cassette 208. Accordingly, the photopolymer plates 102 are prevented also from being exposed to light incoming through the engagement holes 204. When the shutter 210 is slid, both end portions of the shutter 210 in the transverse direction are inserted into the light-shielding groove 214 at both sides of the opening 202 in the transverse direction, and thus, the sliding of the shutter 210 is guided by the light-shielding groove 214. As a result, the opening-closing operation of the shutter 210 is improved.

A magnet 216 serving as a member for detection is provided at a rear end of the shutter 210 in the closing direction (FIG. 3). The sensors are magnetic proximity sensors 218 and 220 provided inside the trolley 200 in accordance with the magnet 216. The upper magnetic proximity sensor 218 is positioned in accordance with a position of the magnet 216 in the state in which the shutter 210 is closed. When the shutter 210 is slid in the closing direction and the magnetic proximity sensor 218 detects that the magnet 216 is in proximity thereto, the state in which the shutter 210 is closed is detected. On the other hand, the lower magnetic proximity sensor 220 is positioned in accordance with a position of the magnet 216 in the state in which the shutter 210 is opened. When the shutter 210 is slid in the opening direction and the magnetic proximity sensor 220 detects that the magnet 216 is in proximity thereto, the state in which the shutter 210 is opened is detected.

A predetermined number of handles 222 (four handles in the present embodiment) are provided on side walls of the accommodating cassette 208 (FIGS. 1 and 8). This structure makes it easy for the accommodating cassette 208 to be transported.

Next, an operation of the present embodiment will be described.

In the automatic exposure apparatus 100 for printing plates, which has the above-described structure, the turntables 212 are rotated so as to rotate the sprockets 206 in a darkroom, and the shutter 210 which is flexible is thereby slid in the opening direction so as to open the opening 202 of the accommodating cassette 208. In this opened state, the plurality of photopolymer plates 102 which are stacked are accommodated into the accommodating cassette 208 through the opening 202.

After that, the turntables 212 are rotated so as to rotate the sprockets 206, and the shutter 210 is thereby slid in the closing direction so as to close the opening 202. In this state in which the opening 202 is closed, the accommodating cassette 208 is loaded on the trolley 200 and the accommodating cassette 208 is accommodated in the plate accommodating portion 104 via the trolley 200, and as a result, the accommodating cassette 208 is loaded into the automatic exposure apparatus 100 for printing plates. Accordingly, even if light is emitted from the outside of the accommodating cassette 208 while the accommodating cassette 208 is being transported from the darkroom to the plate accommodating portion 104, the photopolymer plates 102 can be prevented from being unnecessarily exposed to light and thus their quality is not adversely affected.

After the accommodating cassette 208 has been loaded into the automatic exposure apparatus 100 for printing plates, the sprockets 206 are rotated by a driving force from the trolley 200, and the shutter 210 is thereby slid in the opening direction so as to open the opening 202. In this opened state, the photopolymer plate 102 is taken out of the accommodating cassette 208 through the opening 202, and an image is recorded onto an exposure surface of the photopolymer plate 102.

When the magnetic proximity sensors 218 and 220, which are provided inside the trolley 200 so as to correspond with positions of the magnet 216 in the states in which the shutter 210 is closed and opened, detect that the magnet 216 is in proximity thereto, the state in which the shutter 210 is closed or opened is detected.

The shutter 210 is configured as a thin plate, and thus, the accommodating cassette 208 can be accordingly thin. As a result, the accommodating cassette 208 is lightened such that an operation of conveying the accommodating cassette 208 (such as an operation of loading the accommodating cassette 208 onto the trolley 200) can be facilitated (the accommodating cassette 208 can be conveyed without requiring large amount of energy).

In the state in which the opening 202 of the accommodating cassette 208 is closed by the shutter 210, the peripheral edge of the shutter 210 is inserted into the light-shielding groove 214 formed at the periphery of the opening 202. Accordingly, even if a special light-shielding member is not used, the photopolymer plates 102 can be completely prevented from being unnecessarily exposed to light and thus the quality is not adversely affected.

Further, as described above, a special light-shielding member does not need to be used, and thus, the accommodating cassette 208 can be thinner. As a result, the accommodating cassette 208 is made even lighter such that the operation of conveying the accommodating cassette 208 can be further facilitated.

When the sprockets 206 provided in the accommodating cassette 208 are rotated, the engagement pins 206A of the sprocket 206 sequentially engage with the engagement holes 204 of the shutter 210, and the shutter 210 is slid. As a result, an operation of sliding the shutter 210 becomes smooth, and the operation of opening and closing of the shutter 210 can be carried out satisfactorily.

Since the engagement hole 204 of the shutter 210 is circular, and a cross-section of the engagement pin 206A of the sprocket 206 is circular, load applied when the engagement pin 206A engages with the engagement hole 204 is dispersed. Accordingly, the shutter 210 and the sprockets 206 can be prevented from being broken or deformed.

Since the magnet 216 is provided at the rear end of the shutter 210 in the closing direction, the magnet 216 is always positioned inside the accommodating cassette 208 so as not to be exposed at (protrude from) the opening 202. Moreover, the magnetic proximity sensors 218 and 220 are provided inside the trolley 200. Accordingly, safety and design is satisfactory.

Furthermore, as described above, the magnet 216 does not protrude from the opening 202 of the accommodating cassette 208, and thus, the accommodating cassette 208 can be even thinner. As a result, the accommodating cassette 208 is made even lighter such that the operation of conveying the accommodating cassette 208 can be facilitated even more.

(Modified Example)

FIG. 10 shows a perspective view of an accommodating cassette 250 relating to a modified example of the present embodiment.

In the accommodating cassette 250 relating to the present modified example, a predetermined number of fixed casters 252 (two casters in the present modified example) are provided at a bottom portion thereof. The casters 252 can support the accommodating cassette 250. As a result, the accommodating cassette 250 can be conveyed in the state in which the accommodating cassette 250 is supported by the casters 252, and thus, regardless of weight of the accommodating cassette 250, an operation of conveying the accommodating cassette 250 can be reliably facilitated (the accommodating cassette 250 can be reliably conveyed without using a large amount of energy).

In the present modified example, the fixed casters 252 are used. However, adjustable casters may be used.

Further, in the present embodiment (including the modified example), the magnetic proximity sensors 218 and 220 are provided inside the trolley 200. However, the magnetic proximity sensors 218 and 220 may be provided inside the accommodating cassette 208.

What is claimed is:

1. An exposure apparatus for printing plates, into which is loaded a cassette, having therein a predetermined number of printing plates accommodated in a stacked state and which takes the printing plates out of the cassette, and records an image onto an exposure surface of each of the printing plates; wherein the apparatus comprises:
    an opening for accommodating the printing plates into the cassette and for taking the printing plates out of the cassette, which opening is provided at a portion of the cassette which portion opposes the exposure surface of the printing plate; and
    a shutter provided at the opening, the shutter comprising a flexible structure slidable to a closed position closing the opening to the cassette, and to an open position, in which the opening to the cassette is open.

2. The device of claim 1, wherein the opening includes a periphery having opposite sides, with a groove defined in each side, and the shutter includes opposite peripheral edges which are each received in the groove and slide therealong as the shutter is moved to the closed and open positions.

3. The device of claim 1, further comprising sprockets rotatably mounted in the cassette, the sprockets including engagement pins and the shutter including engagement holes corresponding to the engagement pins, with the shutter entrained around the sprockets and moving to closed and open positions when the sprockets rotate.

4. The device of claim 1, further comprising:
    a detection member provided on the shutter and movable with the shutter when the shutter moves to open and closed positions; and
    sensors provided in accordance with locations of the detection member when the shutter is in the open and closed positions, the sensors detecting proximity of the detection member and producing an electronic output indicating when the shutter is in the open and closed positions.

5. The device of claim 1, further comprising casters mounted to the cassette, which support the cassette and provide for rolling the cassette along a surface.

6. The device of claim 1, wherein the shutter comprises a spring steel having a severity quench of approximately ½ H, and a thickness substantially equal to 0.15 mm.

7. The device of claim 2, further comprising sprockets rotatably mounted in the cassette, the sprockets including engagement pins and the shutter including engagement holes corresponding to the engagement pins, with the shutter entrained around the sprockets and moving to closed and open positions when the sprockets rotate.

8. The device of claim 2, wherein the shutter comprises a spring steel having a severity quench of approximately ½ H, and a thickness substantially equal to 0.15 mm.

9. The device of claim 3, wherein said engagement holes are circular and the engagement pins have a circular cross-section.

10. The device of claim 3, further comprising:
    a detection member provided on the shutter and movable with the shutter when the shutter moves to open and closed positions; and
    sensors provided in accordance with locations of the detection member when the shutter is in the open and closed positions, the sensors detecting proximity of the detection member and producing an electronic output indicating when the shutter is in the open and closed positions.

11. The device of claim 4, wherein the sensors magnetically detect the detection member.

12. The device of claim 4, wherein said detection member comprises a magnet.

13. The device of claim 9, further comprising casters mounted to the cassette, which support the cassette and provide for rolling the cassette along a surface.

14. An exposure apparatus accommodating printing plates prior to exposure, wherein each printing plate includes an exposure surface, the device comprising:
    (a) a cassette adapted for removable mounting to the exposure apparatus, the cassette having an interior sized for receiving and storing printing plates in a stacked arrangement, with each printing plate received in the cassette having its exposure surface facing an opening, the cassette including the opening sized for receipt and removal of printing plates through the opening, the opening including a periphery having opposite sides, with a groove defined in each side; and
    (b) a shutter provided at the opening, the shutter comprising a flexible thin plate slidable to a closed position closing the opening to the cassette, and to an open position, in which the opening to the cassette is open, the shutter including opposite peripheral edges which are each received in the groove and slide therealong as the shutter is moved to the closed and open positions.

15. The device of claim 14, further comprising sprockets rotatably mounted in the cassette, the sprockets including engagement pins and the shutter including engagement holes corresponding to the engagement pins, with the shutter entrained around the sprockets and moving to closed and open positions when the sprockets rotate.

16. The device of claim 14, further comprising:
    a detection member provided on the shutter and movable with the shutter when the shutter moves to open and closed positions; and
    sensors provided in accordance with locations of the detection member when the shutter is in the open and closed positions, the sensors detecting proximity of the detection member and producing an electronic output indicating when the shutter is in the open and closed positions.

17. The device of claim 14, further comprising casters mounted to the cassette, which support the cassette and provide for rolling the cassette along a surface.

18. The device of claim 14, wherein the shutter comprises a spring steel having a severity quench of approximately ½ H, and a thickness substantially equal to 0.15 mm.

19. The device of claim 15, wherein said engagement holes are circular and the engagement pins have a circular cross-section.

20. The device of claim 16, wherein the sensors magnetically detect the detection member.

21. The device of claim 16, wherein said detection member comprises a magnet.

22. An exposure apparatus accommodating printing plates prior to exposure, the device comprising:
 (a) a cassette adapted for removable mounting to the exposure apparatus, the cassette having an interior sized for receiving and storing printing plates in a stacked arrangement, the cassette including an opening sized for receipt and removal of printing plates through the opening;
 (b) a shutter provided at the opening, the shutter comprising a flexible structure slidable to a closed position closing the opening to the cassette, and to an open position, in which the opening to the cassette is open;
 (c) a detection member provided on the shutter and movable with the shutter when the shutter moves to open and closed positions; and
 (d) sensors provided in accordance with locations of the detection member when the shutter is in the open and closed positions, the sensors detecting proximity of the detection member and producing an electronic output indicating when the shutter is in the open and closed positions.

23. The device of claim 22, wherein the opening includes a periphery having opposite sides, with a groove defined in each side, and the shutter includes opposite peripheral edges which are each received in the groove and slide therealong as the shutter is moved to the closed and open positions.

24. The device of claim 22, further comprising sprockets rotatably mounted in the cassette, the sprockets including engagement pins and the shutter including engagement holes corresponding to the engagement pins, with the shutter entrained around the sprockets and moving to closed and open positions when the sprockets rotate.

25. The device of claim 22, further comprising casters mounted to the cassette, which support the cassette and provide for rolling the cassette along a surface.

26. The device of claim 22, wherein the sensors magnetically detect the detection member.

27. The device of claim 22, wherein said detection member comprises a magnet.

28. The device of claim 22, wherein the shutter comprises a spring steel having a severity quench of approximately ½ H, and a thickness substantially equal to 0.15 mm.

29. The device of claim 24, wherein said engagement holes are circular and the engagement pins have a circular cross-section.

* * * * *